United States Patent
Kim et al.

(10) Patent No.: US 8,377,613 B2
(45) Date of Patent: Feb. 19, 2013

(54) REFLECTIVE PHOTOMASK AND METHOD OF FABRICATING THE SAME

(75) Inventors: Ni-Eun Kim, Seoul (KR); Yunsong Jeong, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/356,690

(22) Filed: Jan. 24, 2012

(65) Prior Publication Data

US 2012/0122022 A1 May 17, 2012

Related U.S. Application Data

(62) Division of application No. 12/723,991, filed on Mar. 15, 2010, now Pat. No. 8,142,962.

(30) Foreign Application Priority Data

Mar. 16, 2009 (KR) .................. 10-2009-0022311

(51) Int. Cl.
*G03F 1/24* (2012.01)
(52) U.S. Cl. .......................................................... 430/5
(58) Field of Classification Search ............... 430/5, 22, 430/394; 378/35
See application file for complete search history.

(56) References Cited

U.S. PATENT DOCUMENTS

2003/0082460 A1* 5/2003 Stivers et al. .................... 430/5

* cited by examiner

*Primary Examiner* — Stephen Rosasco
(74) *Attorney, Agent, or Firm* — F. Chau & Associates, LLC

(57) ABSTRACT

A reflective photomask comprises a photomask substrate, a photomask pattern, formed on an upper surface of the photomask substrate, at least one alignment mark, formed on the upper surface of the photomask substrate, for aligning the reflective photomask with an exposure apparatus, and at least one fiducial mark, formed on a lower surface of the photomask substrate, for determining locations of defects in the photomask pattern.

18 Claims, 10 Drawing Sheets

[Lower Surface]

[Top Surface]

[Lower Surface]

ved onto a reflective surface. This EUV photo-
REFLECTIVE PHOTOMASK AND METHOD OF FABRICATING THE SAME

CROSS-REFERENCE TO RELATED APPLICATIONS

This application is a divisional application of co-pending U.S. application Ser. No. 12/723,991 filed Mar. 15, 2010, which claims priority under 35 U.S.C. §119 of Korean Patent Application 10-2009-0022311, filed on Mar. 16, 2009, the entire contents of which are hereby incorporated by reference in their entirety.

BACKGROUND

The present disclosure herein relates to a reflective photomask and a method of fabricating the same.

There has been an increasing demand for forming smaller patterns on semiconductor substrates. In order to satisfy this demand, the wavelength of a light source, which is used to form patterns on semiconductor devices in a lithography step, has become shorter. For example, in the past, the lithography step utilized light having a g-line wavelength band (e.g., approximately 436 nm) or an i-line wavelength band (e.g., approximately 365 nm). Use of light having a deep-ultraviolet wavelength band is becoming more prevalent. Moreover, the lithography step will likely utilize light having an extreme-ultraviolet (EUV) wavelength band in the future.

Because light having an EUV wavelength band is mostly absorbed by refractive optical materials, EUV lithography utilizes a reflective optical system instead of a refractive optical system. Thus, EUV lithography requires a reflective photomask in which circuit patterns to be transferred onto a wafer are formed on a reflective surface. This EUV photomask may include a plurality of layers. Various types of defects may occur when forming a plurality of layers on the EUV photomask. It may be difficult or impossible to completely remove these defects. Thus, the cost of fabricating EUV photomasks is greatly affected by defect control.

Therefore, a need exists for a reflective photomask and for a method of controlling defects during the fabrication of the reflective photomask

SUMMARY

The present disclosure is to provide a method of fabricating an extreme ultraviolet photomask that can maintain the accuracy of location information for defects.

The present disclosure is to provide a photomask that can precisely apply a defect avoidance technique.

According to an exemplary embodiment of the inventive concept, a reflective photomask comprises a photomask substrate, a photomask pattern, formed on an upper surface of the photomask substrate, at least one alignment mark, formed on the upper surface of the photomask substrate, for aligning the reflective photomask with an exposure apparatus, and at least one fiducial mark, formed on a lower surface of the photomask substrate, for determining locations of defects in the photomask pattern.

In another exemplary embodiment, the photomask pattern comprises a plurality of thin layers.

In another exemplary embodiment, the plurality of thin layers comprises at least one of a multilayer, a capping layer, a buffer layer, an absorbing layer, and a photoresist layer.

In another exemplary embodiment, the plurality of thin layers comprises alternating molybdenum layers and silicon layers.

In another exemplary embodiment, the photomask pattern and the alignment mark are formed on a top layer of the upper surface and the fiducial mark is formed on a bottom layer of the lower surface.

In another exemplary embodiment, the photomask substrate comprises a material having a low thermal expansion property, such as, for example, glass.

In another exemplary embodiment, the reflective photomask comprises a conductive layer for fixing the reflective photomask to an exposure apparatus via an electrostatic chucking effect.

In another exemplary embodiment, the plurality of thin layers forms a Bragg reflector.

According to an exemplary embodiment of the inventive concept, a method of fabricating a reflective photomask comprises forming at least one fiducial mark on a lower surface of a photomask substrate, forming a plurality of thin layers on an upper surface of the photomask substrate, inspecting the plurality of thin layers for defects, and extracting defect data corresponding to the plurality of thin layers, wherein the defect data comprises location information corresponding to defects formed in the plurality of thin layers.

In another exemplary embodiment, the location information uses a location of the fiducial mark as a reference point.

In another exemplary embodiment, the method comprises aligning a lower optical system with the fiducial mark, inspecting the plurality of thin layers for defects using an upper optical system, determining locations of the defects relative to the fiducial mark based on a position of the upper optical system relative to a position of the lower optical system, and storing the locations of the defects as the defect data.

In another exemplary embodiment, the method comprises aligning a lower optical system with an upper optical system, inspecting the plurality of thin layers for defects using the upper optical system, determining locations of the defects relative to the fiducial mark based on a position of the upper optical system relative to a position of the lower optical system, and storing the locations of the defects as the defect data, wherein the positions of the upper optical system and the lower optical system are fixed.

In another exemplary embodiment, the method comprises preparing a defect avoidance layout based on defect avoidance data, wherein the defect avoidance data is obtained by comparing the defect data with photomask pattern data, and the defect avoidance layout minimizes an overlap between circuit patterns and the defects, and patterning the defect avoidance layout onto the thin layers on the upper surface of the photomask substrate.

In another exemplary embodiment, the method comprises determining a position of the fiducial mark using a lower optical system, wherein the defect avoidance layout is provided as a relative coordinate with respect to the fiducial mark.

In another exemplary embodiment, patterning the thin layers comprises aligning a lower optical system with an exposure system and irradiating a light source onto a photoresist layer of the thin layers.

In another exemplary embodiment, the light source is irradiated onto a predetermined region of the photoresist layer based on defect avoidance data.

In another exemplary embodiment, patterning the layers comprises aligning a lower optical system with the fiducial mark and irradiating a light source onto a photoresist layer of the thin layers.

In another exemplary embodiment, the light source is irradiated onto a predetermined region of the photoresist layer based on defect avoidance data.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF PREFERRED EMBODIMENTS

Advantages and features of the present invention and methods of accomplishing the same may be understood more readily by reference to the following detailed description of preferred embodiments and the accompanying drawings. The exemplary embodiments of the inventive concept may, however, be embodied in many different forms and should not be construed as being limited to the embodiments set forth herein. Rather, these embodiments are provided so that this disclosure will be thorough and complete and will fully convey the scope of the inventive concept to those skilled in the art, and the embodiments of the inventive concept will only be defined by the appended claims.

It will be understood that when any layers such as a conductive layer, a semiconductor layer, and an insulating layer are referred to as being "on" another material layer or substrate, it may be directly on the other material layer or substrate or intervening elements or layers may be present. In drawings, the thickness of layers and regions is exaggerated to effectively describe technical details. It will be understood that, although the terms first, second, etc. are used herein to describe various elements, these elements should not be limited by these terms. These terms are used to distinguish one element from another. Accordingly, a layer being referred to as a first layer in one embodiment may be referred to as a second layer in another embodiment. Each embodiment described and illustrated herein includes a complementary embodiment thereof.

Figure 1:
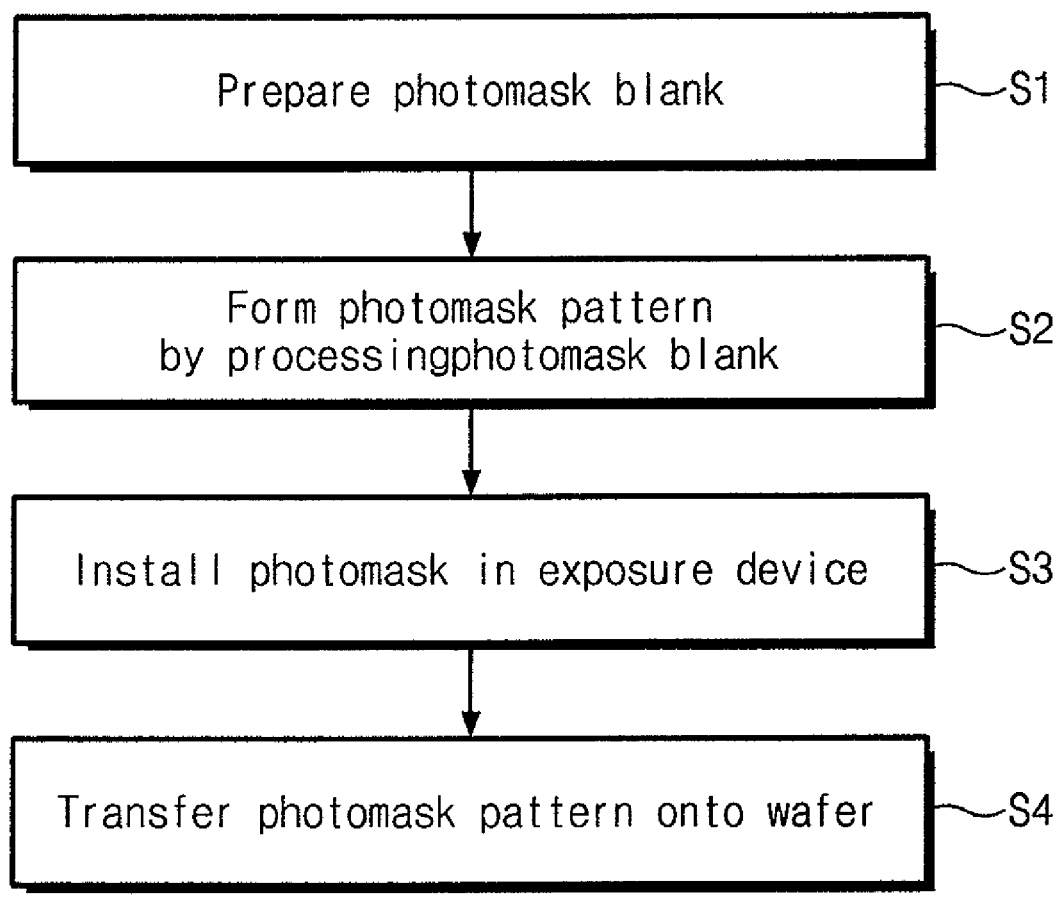
FIG. 1 is a flowchart illustrating a step of fabricating and applying a general photomask according to an exemplary embodiment of the inventive concept.

FIG. 1 is a flowchart illustrating a step of fabricating and applying a general photomask, according to an embodiment of the inventive concept.

Referring to FIG. 1, the steps of fabricating the photomask include the step of preparing a photomask blank (S1) and forming photomask patterns (e.g., circuit patterns and prototype patterns)—which will be transferred onto a wafer—by processing the photomask blank (S2). The step of applying the photomask includes the step of installing the fabricated photomask in an exposure apparatus (S3) and transferring the photomask patterns onto the wafer (S4).

Figure 2:
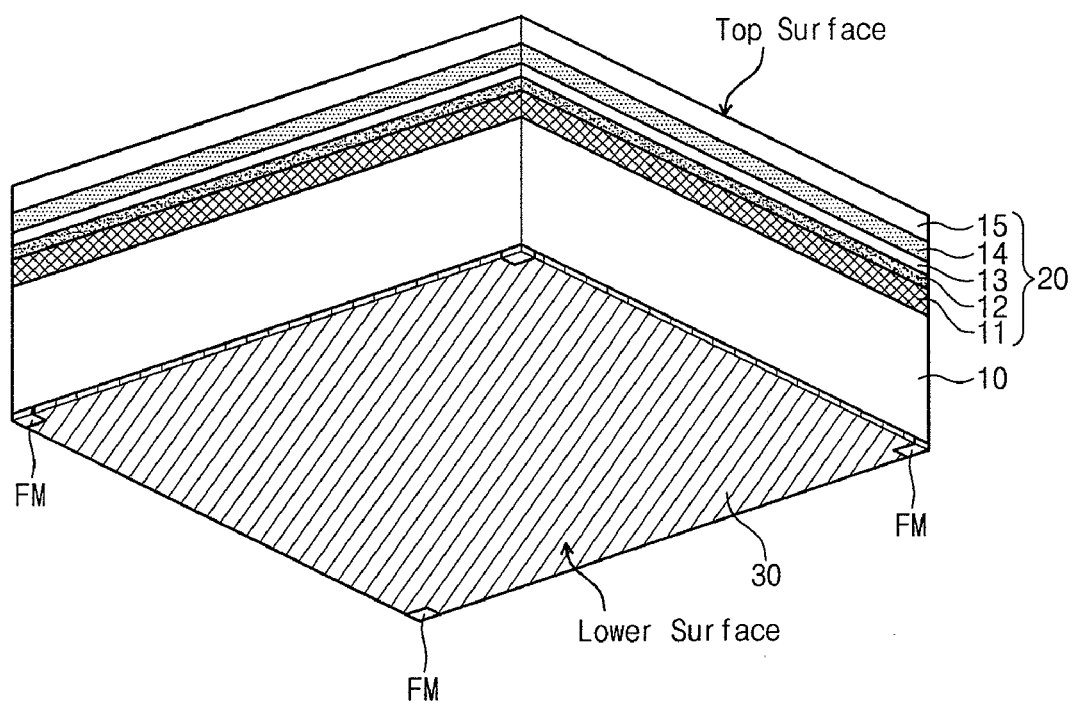
FIG. 2 is a perspective view illustrating a reflective photomask blank according to an exemplary embodiment of the inventive concept.

FIG. 2 is a perspective view illustrating a reflective photomask blank according to an embodiment of the inventive concept.

Referring to FIG. 2, the reflective photomask blank according to an exemplary embodiment of the inventive concept may include a photomask substrate 10 (hereinafter referred to as a "substrate"), thin layers 20 formed on an upper surface of the substrate 10, and at least one fiducial mark FM formed on a lower surface of the substrate 10. The thin layers 20 may include at least one of a multilayer 11, a capping layer 12, a buffer layer 13, an absorbing layer 14, and a mask layer 15 which may be sequentially stacked, as illustrated in FIG. 2.

The substrate 10 may be formed of a material having a low thermal expansion property (e.g., glass). In order to improve the reflectance of an extreme ultraviolet (EUV) light used in EUV exposure system, the multilayer 11 may be comprised of a plurality of thin layers, forming a Bragg reflector. In a Bragg reflector, the boundary between each of the plurality of layers causes a partial reflection of a light source irradiating the multilayer 11. The multilayer 11 may comprise approximately 40 to 60 thin layers. According to an exemplary embodiment of the inventive concept, the multilayer 11 may include molybdenum layers and silicon layers which are alternately stacked. For example, each of the molybdenum layers may be substantially formed to have a thickness of approximately 2.8 nm, and each of the silicon layers may be substantially formed to have a thickness of approximately 4.0 nm or 4.1 nm. These values are for exemplary purposes, and the thickness of the thin layers may be set to different values in consideration of the wavelength of the EUV light to be used.

The absorbing layer 14 may be formed of any one of materials capable of absorbing the EUV light. According to an exemplary embodiment of the inventive concept, the absorbing layer 14 may be formed of a conductive absorber such as, for example, tantalum nitride (TaN). However, the material used for the absorbing layer 14 is not limited to the exemplified tantalum nitride. The buffer layer 13 or the capping layer 12 may be used as an etch stop layer in an etching step of patterning the absorbing layer 14. According to an exemplary embodiment of the inventive concept, the buffer layer 13 or the capping layer 12 may comprise, for example, a silicon nitride layer or a silicon oxide layer. According to another exemplary embodiment of the inventive concept, the absorbing layer 14 may be directly formed on the multilayer 11 without the presence of the buffer layer 13 or the capping layer 12. The mask layer 15 may be a photoresist layer.

According to an exemplary embodiment of the inventive concept, a conductive layer 30 may be formed on the lower surface of the substrate 10 so as to define shapes or locations of the fiducial mark(s) FM. The presence of the conductive layer 30 allows an electrostatic chucking effect to be used to fix the photomask to the exposure apparatus. The fiducial mark(s) FM may be formed on the lower surface of the substrate 10 regardless of the existence of the conductive layer 30.

The fiducial mark(s) FM is used as a reference point for describing the locations of defects which may occur during formation of the thin layers 20. When the fiducial mark(s) FM is formed on the upper surface of the substrate 10, the shape of the fiducial mark(s) FM may gradually be distorted as the thickness or the number of the thin layers 20 stacked on the upper portion of the fiducial mark(s) FM increases. This distortion may result in decreased precision of the detected locations of the defects. When the fiducial mark(s) FM is formed on the lower surface of the substrate 10, as described above, the fiducial mark(s) FM is not influenced by the formation of the thin layers 20 or by the number or thickness of the layers. As a result, the function of the fiducial mark(s) FM as a spatial reference point does not deteriorate.

Figure 3A:
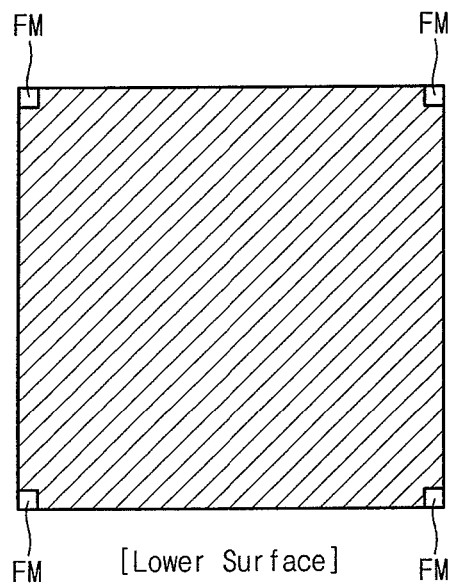
FIGS. 3A and 3B are plan views illustrating a reflective photomask according to an exemplary embodiment of the inventive concept.
Figure 13:
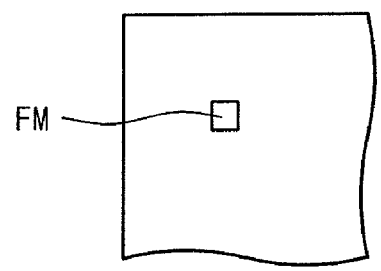
FIG. 13 is a plan view illustrating a reflective photomask according to an exemplary embodiment of the inventive concept.

The fiducial mark(s) FM may be formed on at least one or all of the corners of the substrate 10 as illustrated in FIGS. 2 and 3A. Alternatively, the fiducial mark(s) FM may be formed at any position distant from edges of the substrate 10 as illustrated in FIG. 13.

Figure 3B:
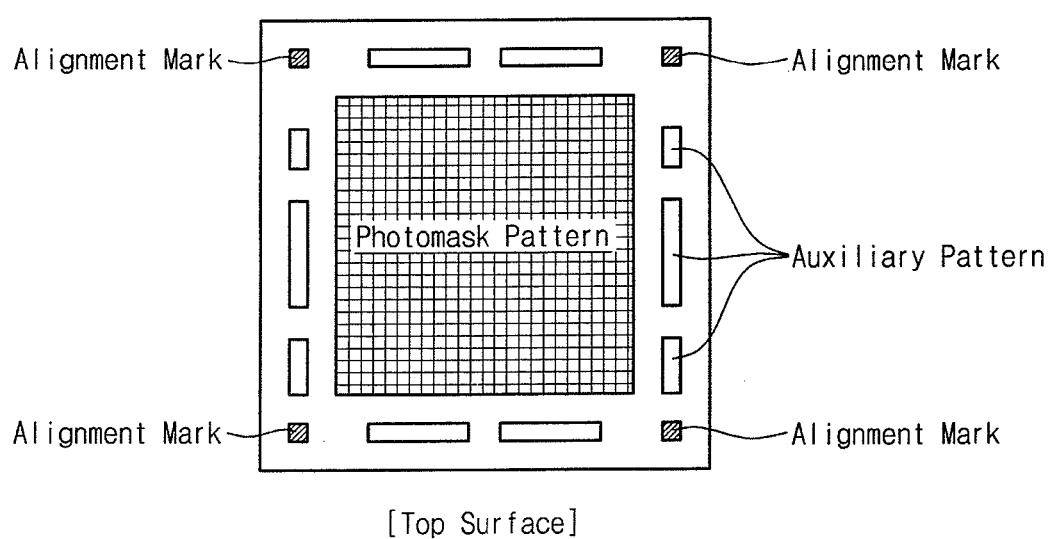

FIGS. 3A and 3B are plan views illustrating the reflective photomask according to an exemplary embodiment of the inventive concept. The reflective photomask illustrated in FIGS. 3A and 3B may be formed by patterning the photomask blank of FIG. 2

Referring to the exemplary embodiments illustrated in FIGS. 3A and 3B, the photomask may include photomask patterns and a fiducial mark(s) FM formed on the upper and lower surfaces of the substrate 10, respectively. Alignment marks for the alignment between the photomask and the exposure apparatus, and auxiliary patterns for other various functions may be further disposed on the upper surface of the substrate 10, as illustrated in FIG. 3B.

The photomask patterns, the alignment marks, and the auxiliary patterns may be obtained by patterning the thin layers 20 formed on the upper surface of the substrate 10. The step of patterning the thin layers 20 will be described in detail below with reference to FIG. 4.

The alignment marks formed on the upper surface of the substrate 10 are distinguished from the fiducial mark(s) FM formed on the lower surface of the substrate 10 because the alignment marks are used to align the photomask and the exposure apparatus and the fiducial mark(s) FM are used to detect the locations of defects which may occur during the step of forming the thin layers 20. Because the alignment marks are formed by patterning the thin layers 20, the alignment marks may not be used as fiducial marks FM.

According to another exemplary embodiment of the inventive concept, the fiducial marks FM are formed before the thin layers 20 are patterned and are not removed subsequent to the fabrication of the photomask. In this case, the fiducial marks FM may be used as alignment marks when installing the photomask in the exposure apparatus.

Further, the photomask patterns may include inner alignment patterns (not illustrated) used for the alignment between the patterns formed on the wafer. The inner alignment patterns may be formed in a scribe lane region between chip regions. Because the inner alignment patterns are formed after the thin layers 20 of the photomask blank are patterned, the inner alignment patterns are not used for the step of patterning the thin layers 20.

Figure 4:
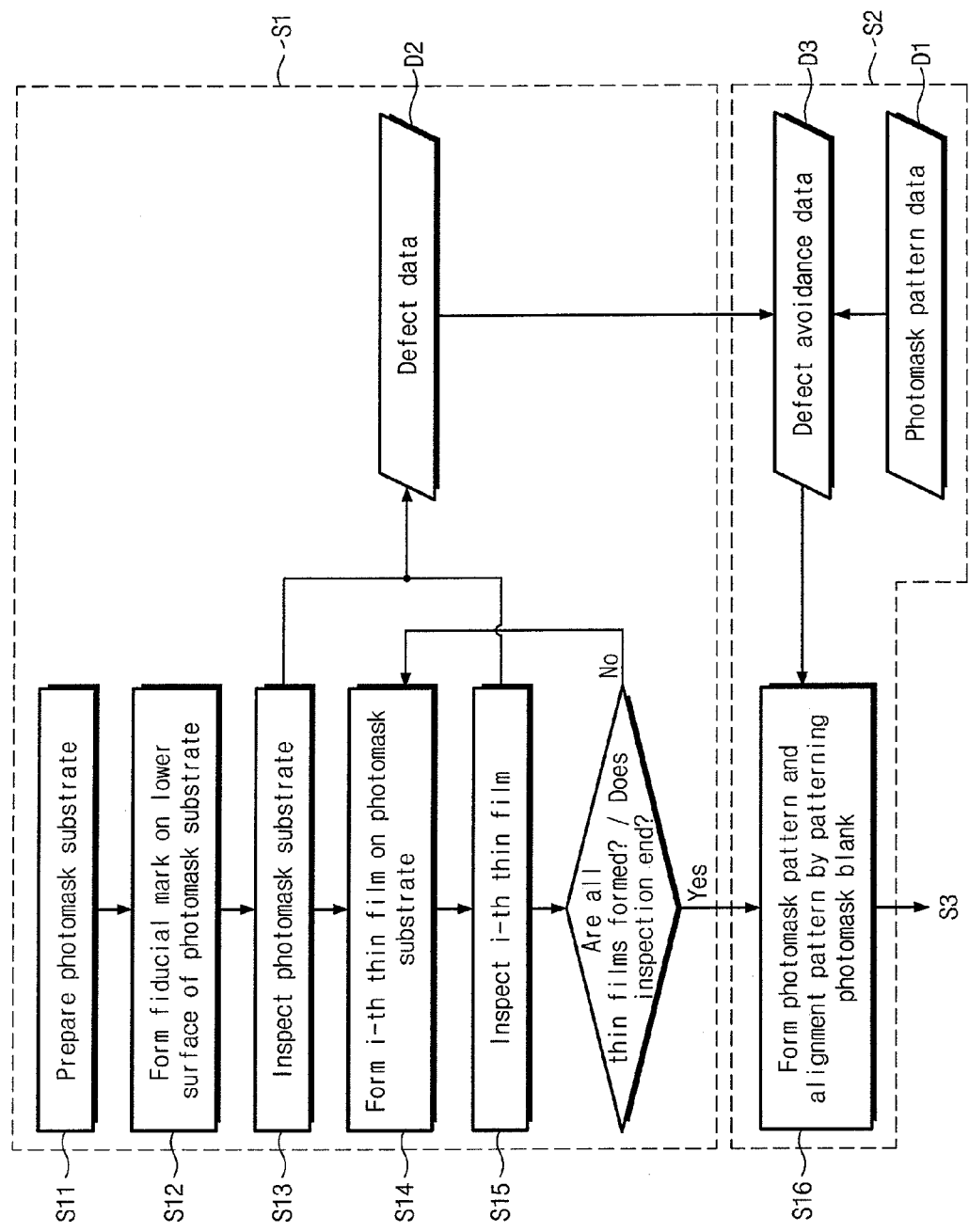
FIG. 4 is a flowchart illustrating a step of fabricating a photomask according to an exemplary embodiment of the inventive concept.

FIG. 4 is a flowchart illustrating more fully the step of fabricating the photomask according to an exemplary embodiment of the inventive concept.

Referring to FIGS. 1 and 4, the step S1 of preparing the photomask blank may include steps of preparing the photomask substrate 10 (S11), forming the fiducial mark(s) FM on the lower surface of the photomask substrate 10 (S12), and forming the thin layers 20 on the upper surface of the photomask substrate 10 (S14).

After forming the thin layers 20, the locations of any defects, which may occur in the step of forming the thin layers, may be inspected (S15). In this step, any number of the thin layers 20 may be inspected. For example, if necessary, inspection of certain thin layers 20 may be omitted. The location of any defects found during step S15 is stored as defect data D2. According to an exemplary embodiment of the inventive concept, the fiducial mark(s) FM may be used as a common reference for defining the location information of the defects occurring in the step of forming each of the thin layers 20. When the fiducial marks FM are formed on the lower surface of the substrate 10, as described above, high precision of the detected location of the defects may be maintained, regardless of the thickness and/or number of layers comprising the thin layers 20.

According to another exemplary embodiment of the inventive concept, the step S13 of inspecting the photomask substrate 10 may be performed before the thin layers 20 are formed. The location information of any defects discovered during the inspection in Step S13 may be added to the defect data D2.

The step S12 of forming the fiducial marks FM may comprise disposing a mold for defining the fiducial marks FM on the lower surface of the substrate 10 and coating the conductive layer 30 on the periphery of the mold. In this case, the fiducial marks FM may be obtained by removing the mold. According to the exemplary embodiment, the mold may be used as a clamping member for fixing the substrate 10 during the step of coating the conductive layer 30 (e.g., by clamping the corners of the lower surface of the substrate 10). In this case, as illustrated in FIG. 2, the fiducial marks FM are formed at the corners of the lower surface of the substrate 10. According to another exemplary embodiment of the inventive concept, the step S12 of forming the fiducial marks FM may further include forming the conductive layer 30 on the entire lower surface of the substrate 10 and patterning the conductive layer 30. In this case, the location of the fiducial marks FM and the shape of the fiducial marks FM may be freely selected.

The step S2 of processing the photomask blank may include creating defect avoidance data D3, which may be used during the patterning of the photomask blank. The defect avoidance data D3 may be prepared by using photomask pattern data D1, which corresponds to the type of photomask being used, and/or the defect data D2, which is created during the step S1 of preparing the photomask blank.

Photomask pattern data D1 may be used to provide information on the position of the circuit patterns (e.g., the photomask patterns) to be transferred onto the wafer. Photomask pattern data D1 may be provided as coordinate information with respect to a predetermined reference point (hereinafter referred to as a "design reference point"). As described above, defect data D2 includes the coordinate information of the defects determined by using the fiducial mark(s) FM as a reference point (hereinafter referred to as a "blank reference point"). Defect avoidance data D3 can provide information (hereinafter referred to as "avoidance information") regarding how the design reference point corresponds to the blank reference point. Thus, the avoidance data D3 may be used to minimize overlap between the circuit patterns defined in the photomask pattern data D1 and the defects defined in the defect data D2. For example, overlap between the circuit patterns and the defects may be minimized by comparing the defect data with photomask pattern data and preparing a defect avoidance layout to be patterned onto the thin layers 20 of the substrate 10. Avoidance information may be obtained, for example, by using the Numerical Analysis method using a computer such as a simulation, and the avoidance information may be recorded as a relative coordinate between the design reference point and the blank reference point.

Minimizing the overlap between the circuit patterns and the defects prevents defects from being transferred onto the wafer. Because it may be difficult to completely remove defects from the photomask, the defects may remain on the photomask and be transferred onto the wafer. With the use of the defect avoidance data, however, the defects may be prevented from being transferred onto the wafer.

Figure 5:
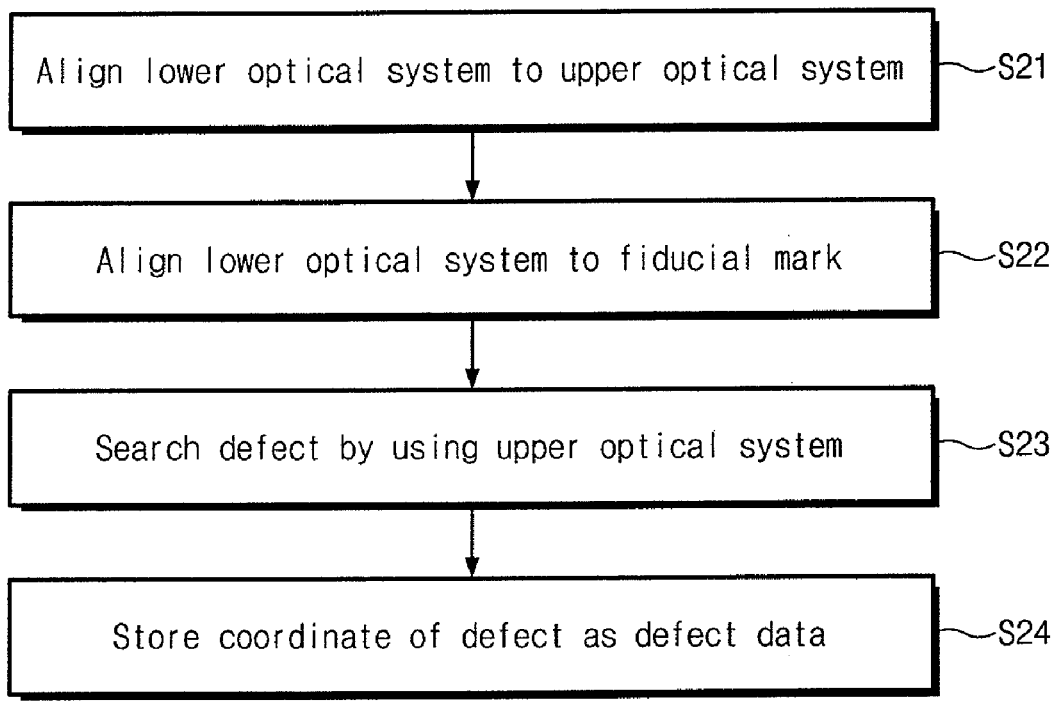
FIG. 5 is a flowchart schematically illustrating a step of inspecting a photomask blank according to an exemplary embodiment of the inventive concept.
Figure 6:
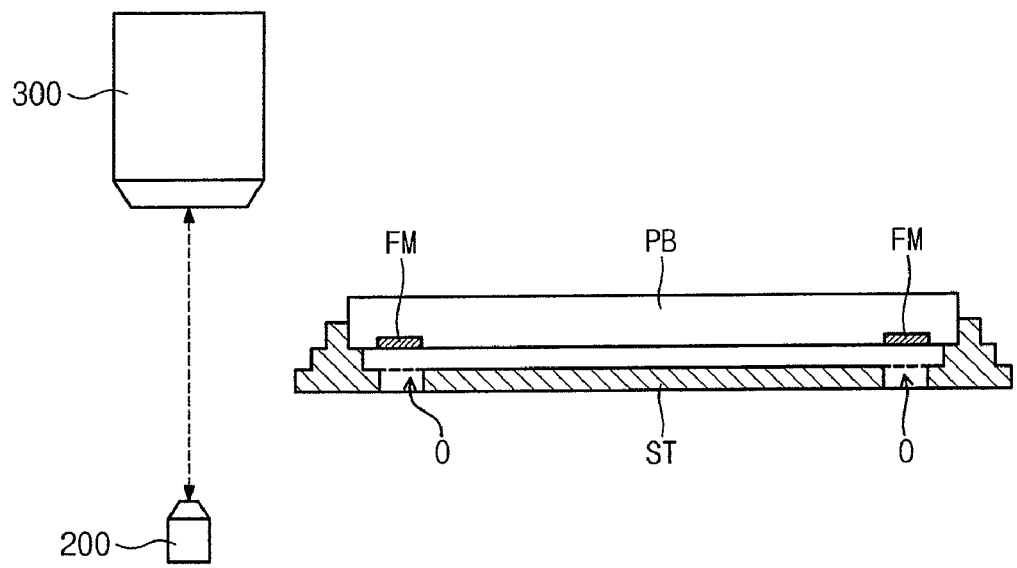
FIGS. 6 through 9 are diagrams illustrating a step of inspecting a photomask blank according to an exemplary embodiment of the inventive concept.
Figure 7:
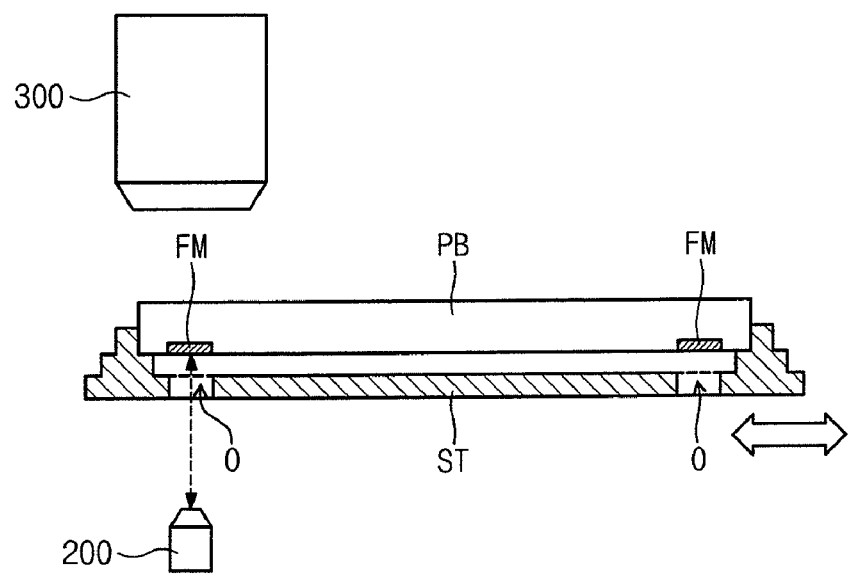
Figure 8:
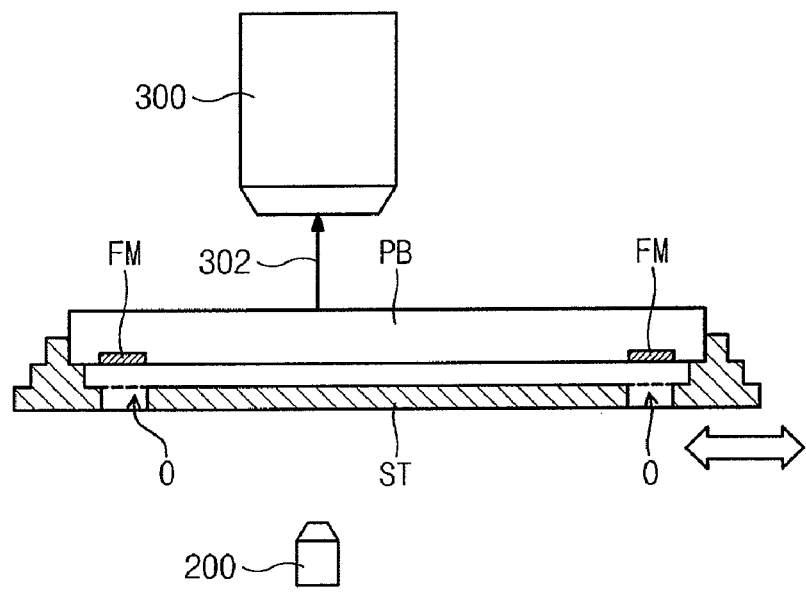

FIG. 5 is a flowchart schematically illustrating the step of inspecting the photomask blank according to an exemplary embodiment of the inventive concept. FIGS. 6 through 8 are diagrams illustrating the step of inspecting the photomask blank according to an exemplary embodiment of the inventive concept. The step of inspecting the photomask blank, which will be described in more detail below, may be performed on each of the thin layers 20 and the photomask substrate 10, as illustrated with reference to FIG. 4.

Referring to FIG. 6, facilities for inspecting the photomask blank will briefly be described. The facilities may include a stage ST in which the photomask blank PB, provided with the fiducial marks FM, is disposed. The facilities may further include an upper optical system 300 located above the stage ST, and a lower optical system 200 located below the stage ST. The upper optical system 300 is configured to inspect the defects generated in the photomask blank PB, and the lower optical system 200 is configured to be aligned with the fiducial mark(s) FM.

Referring to FIGS. 5 through 8, the step S13 or S15 of inspecting the photomask blank, as referred to in FIG. 4, may include: aligning the lower optical system 200 to the upper optical system 300 (S21), as illustrated in FIG. 6; aligning the lower optical system 200 to the fiducial marks FM (S22), as illustrated in FIG. 7; inspecting the defects formed on the photomask blank PB by using the upper optical system 300 (S23), as illustrated in FIG. 7; and storing the coordinates of the defects as the defect data (S24).

In step S21, as referred to in FIG. 5, the lower optical system 200 may be aligned with the upper optical system 300, as illustrated in FIG. 6. Once aligned, the relative position between the lower optical system 200 and the upper optical system 300 may remain fixed.

When the lower optical system 200 is aligned with the fiducial marks FM in step S22, as illustrated in FIG. 7, the defects inspected by the upper optical system 300 in the step S23 are recorded as a relative position with respect to the fiducial marks FM, and are stored as the defect data D2 in the step S24. The step S23 may further include analyzing an emitted light 302, which is emitted from the upper surface of the photomask blank PB and is detected and analyzed by the upper optical system 300, as illustrated in FIG. 8. The emitted light 302 is a result of the optical interaction between the defects and the light incident from the upper optical system 300.

Figure 9:
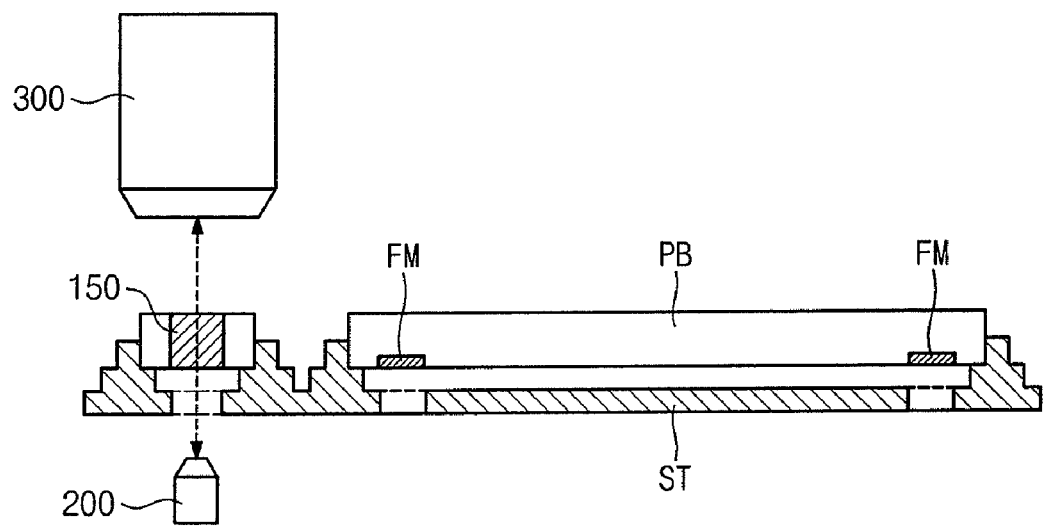

FIG. 9 is a diagram illustrating the alignment between the upper optical system 300 and the lower optical system 200 according to another exemplary embodiment of the inventive concept.

Referring to FIG. 9, a predetermined system alignment pattern 150 may be disposed on one side of the stage ST. Optically discernible upper and lower marks may be formed on the top surface and the bottom surface of the system alignment pattern 150, respectively, and the upper and lower marks may be vertically aligned. In this case, the lower optical system 200 and the upper optical system 300 may be aligned with the lower and upper marks, respectively.

According to an exemplary embodiment of the inventive concept, the lower optical system 200 or the upper optical system 300 may be configured to detect reflected light from a predetermined target. However, because lenses comprising the lower optical system 200 and the upper optical system 300 are formed of opaque materials through which reflected light is difficult to emit, it may be difficult to align the lower optical system 200 and the upper optical system 300 with each other through the manner illustrated in FIG. 6. According to another exemplary embodiment of the inventive concept, as illustrated in FIG. 9, the lower optical system 200 and the upper optical system 300 may be aligned with a system alignment pattern 150, since the system alignment pattern 150 may be used as a common target for the alignment between the lower optical system 200 and the upper optical system 300. In an exemplary embodiment of the inventive concept, the system alignment pattern 150 may be formed at a fixed position with respect to the stage ST or the fiducial mark(s) FM.

Figure 10:
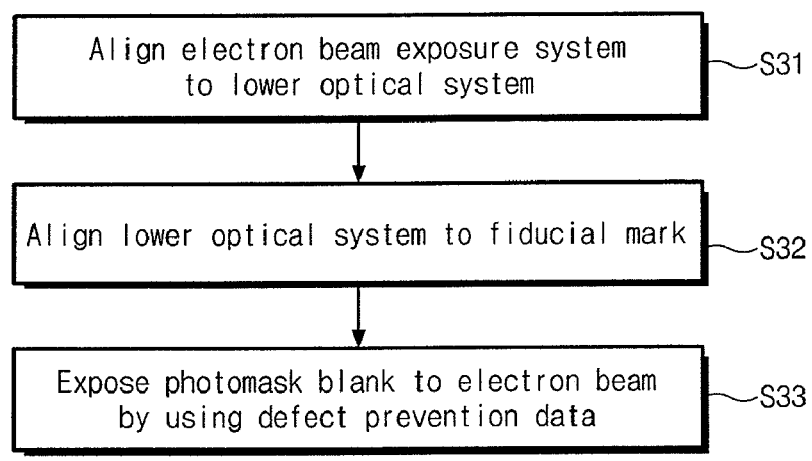
FIG. 10 is a flowchart schematically illustrating a step of patterning a photomask blank used to form a photomask according to an exemplary embodiment of the inventive concept.

FIG. 10 is a flowchart schematically illustrating the step of patterning the photomask blank used to form the photomask according to an exemplary embodiment of the inventive concept.

Figure 11:
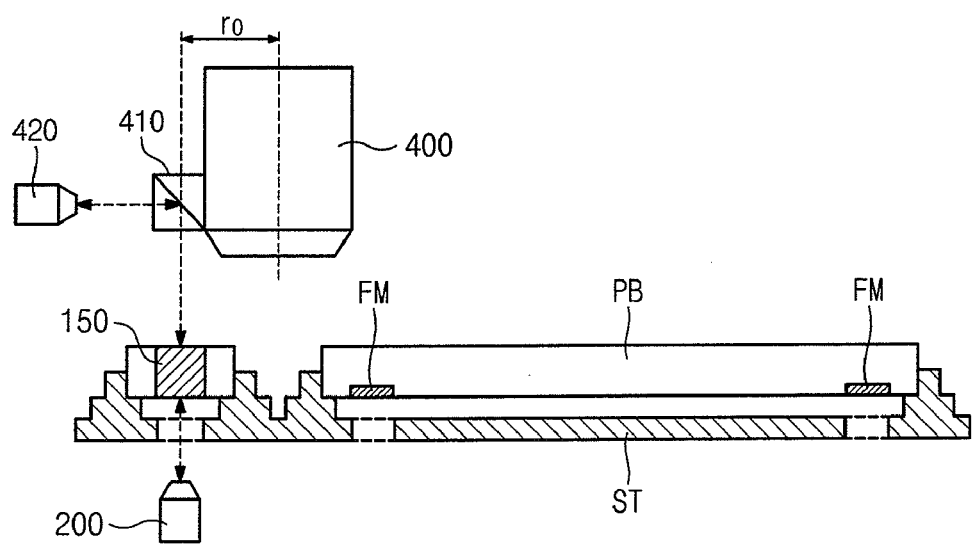
FIGS. 11 and 12 are diagrams illustrating an alignment between an exposure system and a lower optical system according to an exemplary embodiment of the inventive concept.

In the steps S13 and S15 of inspecting the photomask blank, as shown in FIG. 4, the upper optical system 300 is used as means for inspecting the defects. In the step S16 of patterning the photomask blank, means (e.g., an exposure system) for locally supplying energy to the photoresist layer 15 in order to pattern the thin layers 20 is utilized. For example, instead of the upper optical system 300 illustrated with reference to FIG. 6, the exposure system 400 may be located above the stage ST, as illustrated in FIG. 11. The exposure system 400 may be configured to emit, for example, a light source having a narrow flux sectional area onto the photoresist layer 15, however, the light source emitted by the exposure system 400 is not limited thereto.

Referring to FIG. 10, the step of patterning the photomask blank may include: aligning the lower optical system 200 with the exposure system 400 (S31); aligning the lower optical system 200 with the fiducial mark(s) FM (S32); and irradiating a light source onto the photoresist layer 15 of the photomask blank by using the exposure system 400 (S33).

According to an exemplary embodiment of the inventive concept, the lower optical system 200 and the exposure system 400 may be aligned in a similar or modified manner as illustrated with reference to FIGS. 5, 6, and 9. Similarly, the step S32 of aligning the lower optical system 200 with the fiducial mark(s) FM may be performed in a similar or modified manner as illustrated with reference to FIGS. 5 and 7.

The step S33 of irradiating the light source may include selectively irradiating the light source onto a predetermined region of the photoresist layer 15 based on the defect avoidance data D3, as illustrated with reference to FIG. 4. For the purpose of the selective irradiation, the position of the stage ST may be adjusted such that the exposure system 400 is fixed during the step S33 of irradiating the light source.

Figure 12:
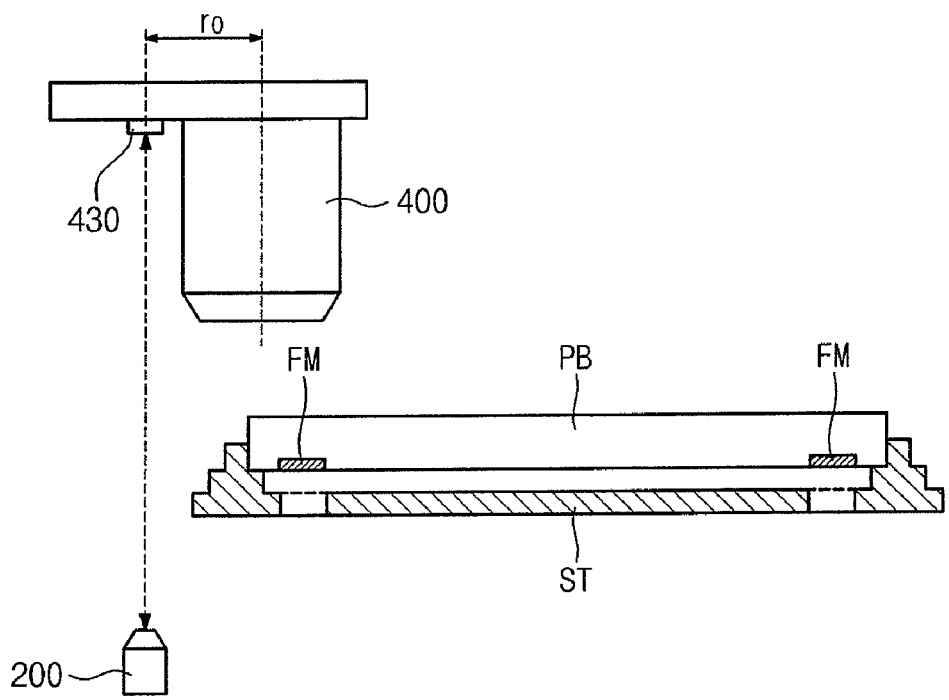

FIGS. 11 and 12 are diagrams illustrating the alignment of the exposure system 400 and the lower optical system 200 according to an exemplary embodiment of the inventive concept.

Referring to FIGS. 11 and 12, the alignment of the lower optical system 200 and the exposure system 400 may be achieved by using an auxiliary optical system having a relative position fixed with respect to the exposure system 400. For example, an auxiliary optical system may include a mirror 410 inclined at an angle of approximately 45° and an alignment optical system 420, which may be disposed on one side of the exposure system 400, as illustrated in FIG. 11. According to another exemplary embodiment of the inventive concept, an auxiliary optical system may include a flat mirror 430 disposed on one side of the exposure system 400, as illustrated in FIG. 12.

According to the exemplary embodiment of the inventive concept illustrated in FIG. 11, the alignment optical system 420 aligns the mirror 410, which is inclined at an angle of approximately 45°, with the lower optical system 200. The optical axes of the exposure system 400 and the lower optical system 200 may be effectively aligned. For example, since the relative position $r_0$ between the mirror 410, which is inclined at an angle of approximately 45°, and the exposure system 400 is fixed, the location of the fiducial mark FM identified by the lower optical system 200 may be effectively used as a reference point when exposing the photomask blank to a light source by the exposure system 400 (Step S33). Similarly, according to the exemplary embodiment of the inventive concept illustrated in FIG. 12, the lower optical system 200 may be aligned with the exposure system 400 in an off-axis manner by using the flat mirror 430 without a separate system alignment pattern 150.

According to another exemplary embodiment of the inventive concept, the off-axis alignment using the auxiliary optical system may be used when aligning the lower optical system 200 with the upper optical system 300.

Figure 14:
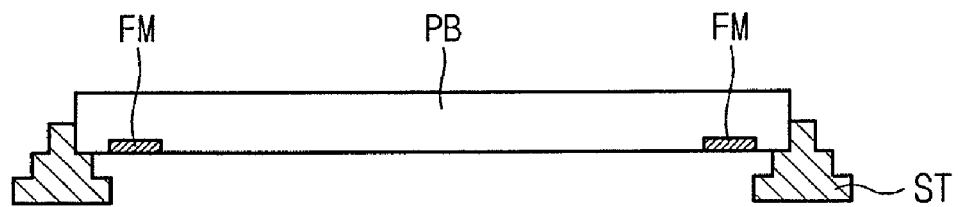
FIGS. 14 and 15 are diagrams illustrating a stage according to an exemplary embodiment of the inventive concept.
Figure 15:
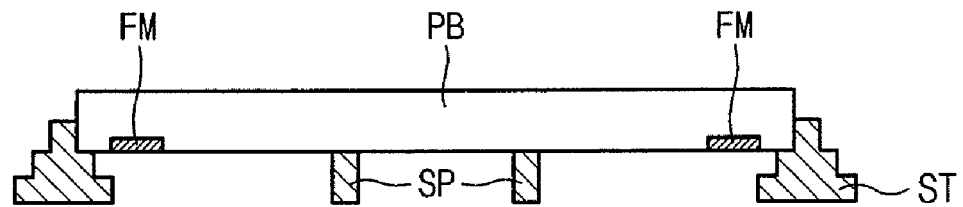

FIGS. 14 and 15 are diagrams illustrating the stage according to an exemplary embodiment of the inventive concept.

As illustrated in FIG. 6, at least one opening O is provided in the stage ST on which the photomask blank PB is disposed. The opening O exposes the fiducial mark(s) FM for alignment with the lower optical system 200. According to another exemplary embodiment of the inventive concept, the stage ST may include an opening substantially exposing the entire lower surface of the photomask blank PB, as illustrated in FIG. 14. According to another exemplary embodiment of the inventive concept, in order to prevent the photomask blank PB from bending, the stage ST may further include a support member SP supporting the lower surface of the photomask blank PB, as illustrated in FIG. 15.

According to the exemplary embodiments of the inventive concept, the fiducial mark(s) FM may be formed on the lower surface of the photomask, allowing the defect avoidance technique, as described above, to be applied. As a result, location information, which is generated when the thin layers are formed on the upper surface of the photomask substrate, may be measured and recorded with high accuracy Although the present invention has been described in connection with the exemplary embodiments of the present invention illustrated in the accompanying drawings, it is not limited thereto. It will be apparent to those skilled in the art that various substitution, modifications and/or changes may be applied thereto without departing from the scope and spirit of the invention.

What is claimed is:

1. A method of fabricating a reflective photomask, the method comprising:
 forming at least one fiducial mark on a lower surface of a photomask substrate;
 forming a plurality of thin layers on an upper surface of the photomask substrate;
 inspecting the plurality of thin layers for defects; and
 extracting defect data corresponding to the plurality of thin layers, wherein the defect data comprises location information corresponding to defects formed in the plurality of thin layers.

2. The method of claim 1, wherein the location information uses a location of the fiducial mark as a reference point.

3. The method of claim 1, further comprising:
 aligning a lower optical system with the fiducial mark;
 inspecting the plurality of thin layers for defects using an upper optical system;
 determining locations of the defects relative to the fiducial mark based on a position of the upper optical system relative to a position of the lower optical system; and
 storing the locations of the defects as the defect data.

4. The method of claim 3, wherein the lower optical system is located below the photomask substrate, and the upper optical system is located above the photomask substrate.

5. The method of claim 1, further comprising:
 aligning a lower optical system with an upper optical system;
 inspecting the plurality of thin layers for defects using the upper optical system;
 determining locations of the defects relative to the fiducial mark based on a position of the upper optical system relative to a position of the lower optical system; and
 storing the locations of the defects as the defect data,
 wherein the positions of the upper optical system and the lower optical system are fixed.

6. The method of claim 5, wherein the lower optical system is located below the photomask substrate, and the upper optical system is located above the photomask substrate.

7. The method of claim 1, further comprising:
 preparing a defect avoidance layout based on defect avoidance data, wherein the defect avoidance data is obtained by comparing the defect data with photomask pattern data, and the defect avoidance layout minimizes an overlap between circuit patterns and the defects; and
 patterning the defect avoidance layout onto the thin layers on the upper surface of the photomask substrate.

8. The method of claim 7, wherein patterning the thin layers comprises:
 determining a position of the fiducial mark using a lower optical system, wherein the defect avoidance layout is provided as a relative coordinate with respect to the fiducial mark.

9. The method of claim 7, wherein patterning the thin layers comprises:
 aligning a lower optical system with an exposure system and irradiating a light source onto a photoresist layer of the thin layers, wherein the lower optical system is located below the photomask substrate, and the exposure system is located above the photomask substrate.

10. The method of claim 9, wherein the light source is irradiated onto a predetermined region of the photoresist layer based on the defect avoidance data.

11. The method of claim 7, wherein patterning the thin layers comprises aligning a lower optical system with the fiducial mark and irradiating a light source onto a photoresist layer of the thin layers.

12. The method of claim 11, wherein the light source is irradiated onto a predetermined region of the photoresist layer based on the defect avoidance data.

13. The method of claim 1, wherein the plurality of thin layers form a photomask pattern on the upper surface of the photomask substrate.

14. The method of claim 1, wherein the fiducial mark is formed before forming the plurality of thin layers, and the reflective photomask is aligned with an exposure apparatus based on a location of the fiducial mark.

15. The method of claim 1, wherein forming the fiducial mark comprises:
forming a conductive layer on the lower surface of the photomask substrate;
disposing a mold on the lower surface of the photomask substrate;
coating the conductive layer on a periphery of the mold; and
removing the mold.

16. The method of claim 1, wherein forming the fiducial mark comprises:
forming a conductive layer on an entirety of the lower surface of the photomask substrate; and
patterning the conductive layer.

17. A method of fabricating a reflective photomask, the method comprising:
forming at least one fiducial mark on a lower surface of a photomask substrate;
forming a plurality of thin layers on an upper surface of the photomask substrate;
inspecting the plurality of thin layers for defects;
extracting defect data corresponding to the plurality of thin layers, wherein the defect data comprises location information corresponding to defects formed in the plurality of thin layers;
preparing a defect avoidance layout based on defect avoidance data, wherein the defect avoidance data is obtained by comparing the defect data with photomask pattern data, and the defect avoidance layout minimizes an overlap between circuit patterns and the defects; and
patterning the defect avoidance layout onto the thin layers on the upper surface of the photomask substrate.

18. The method of claim 17, wherein patterning the thin layers comprises:
forming alignment masks onto the thin layers on the upper surface of the photomask substrate.

* * * * *